(12) United States Patent
Fritzel et al.

(10) Patent No.: US 7,992,348 B2
(45) Date of Patent: Aug. 9, 2011

(54) HIGH-FREQUENCY MEASURING ENCLOSURE FOR MEASURING LARGE TEST OBJECTS

(75) Inventors: Torsten Fritzel, Munich (DE); Hans-Juergen Steiner, Munich (DE)

(73) Assignee: Astrium GmbH, Taufkirchen (DE)

( * ) Notice: Subject to any disclaimer, the term of this patent is extended or adjusted under 35 U.S.C. 154(b) by 3 days.

(21) Appl. No.: 12/095,436

(22) PCT Filed: Nov. 30, 2006

(86) PCT No.: PCT/EP2006/011493
§ 371 (c)(1),
(2), (4) Date: May 29, 2008

(87) PCT Pub. No.: WO2007/062839
PCT Pub. Date: Jun. 7, 2007

(65) Prior Publication Data
US 2008/0271387 A1 Nov. 6, 2008

(30) Foreign Application Priority Data

Nov. 30, 2005 (DE) .......................... 10 2005 057 403
Nov. 30, 2006 (DE) .......................... 10 2006 056 998

(51) Int. Cl.
*G01R 29/08* (2006.01)
*E04H 5/02* (2006.01)
*H01Q 17/00* (2006.01)

(52) U.S. Cl. ............ 52/2.11; 52/80.1; 52/82; 52/173.1; 73/865.6; 324/457

(58) Field of Classification Search ............ 52/2.11, 52/2.13, 2.18, 80.1, 82, 22.19, 2.24, 2.25, 52/2.19, 173.1; 135/87, 121, 124–126; 342/1, 342/165, 173; 324/555, 457; 73/865.6
See application file for complete search history.

(56) References Cited

U.S. PATENT DOCUMENTS

| | | | | |
|---|---|---|---|---|
| 2,594,971 A * | 4/1952 | Moullin | ............................ | 342/1 |
| 2,599,944 A * | 6/1952 | Salisbury | .......................... | 342/1 |
| 2,649,101 A * | 8/1953 | Suits | .............................. | 52/2.16 |
| 2,782,794 A * | 2/1957 | White | ............................. | 52/2.19 |
| 2,812,769 A * | 11/1957 | Schaefer et al. | ................ | 52/2.15 |
| 3,023,758 A * | 3/1962 | Diehl | .............................. | 52/2.23 |
| 3,035,590 A * | 5/1962 | Helmers | ........................ | 52/2.24 |
| 3,246,244 A * | 4/1966 | Darrow et al. | ................. | 343/703 |

(Continued)

FOREIGN PATENT DOCUMENTS

DE 2204506 A1 8/1973
(Continued)

OTHER PUBLICATIONS

International Search Report dated Mar. 15, 2007 w/English translation of pertinent portion (six (6) pages).
(Continued)

*Primary Examiner* — Robert J Canfield
(74) *Attorney, Agent, or Firm* — Crowell & Moring LLP

(57) ABSTRACT

A high-frequency measuring enclosure for measuring large test objects is formed by an air-supported membrane or textile construction of a spherical or ellipsoidal contour, which is substantially pervious to electromagnetic radiation. For absorption of residual electromagnetic radiation that may be reflected by the interior of the surface, the floor is covered with absorber material.

3 Claims, 12 Drawing Sheets

U.S. PATENT DOCUMENTS

| | | | | | |
|---|---|---|---|---|---|
| 3,249,682 | A | * | 5/1966 | Laing | 174/384 |
| 3,256,895 | A | * | 6/1966 | Duquette | 52/2.18 |
| 3,387,412 | A | * | 6/1968 | Kwake | 52/2.14 |
| 3,397,117 | A | * | 8/1968 | Smith et al. | 202/234 |
| 3,432,859 | A | * | 3/1969 | Plant et al. | 343/872 |
| 3,660,951 | A | * | 5/1972 | Cadwell | 52/2.18 |
| 3,742,657 | A | * | 7/1973 | Price | 52/2.14 |
| 3,887,920 | A | * | 6/1975 | Wright et al. | 342/1 |
| 3,908,631 | A | * | 9/1975 | Rom | 126/625 |
| 3,924,363 | A | * | 12/1975 | Candle | 52/2.19 |
| 3,936,984 | A | * | 2/1976 | Yando | 52/2.19 |
| 3,999,333 | A | * | 12/1976 | Amarantos | 52/2.19 |
| 4,015,586 | A | * | 4/1977 | Vroom et al. | 126/587 |
| 4,057,048 | A | * | 11/1977 | Maine | 126/648 |
| 4,099,351 | A | * | 7/1978 | Dalo et al. | 52/2.25 |
| 4,160,443 | A | * | 7/1979 | Brindle et al. | 126/625 |
| 4,160,523 | A | * | 7/1979 | Stevens | 126/625 |
| 4,182,307 | A | * | 1/1980 | Brindle et al. | 126/625 |
| 4,191,168 | A | * | 3/1980 | Allen et al. | 126/648 |
| 4,233,958 | A | * | 11/1980 | Heden | 126/607 |
| 4,236,507 | A | * | 12/1980 | Vincent | 126/595 |
| 4,326,500 | A | * | 4/1982 | Bernhardt et al. | 126/625 |
| 4,381,510 | A | * | 4/1983 | Wren | 343/909 |
| 4,384,435 | A | * | 5/1983 | Polise et al. | 52/2.19 |
| 4,422,445 | A | * | 12/1983 | Pelley | 126/625 |
| 4,465,058 | A | * | 8/1984 | Reick | 126/628 |
| 4,517,957 | A | * | 5/1985 | Pelley | 126/625 |
| 4,521,780 | A | * | 6/1985 | Preikschat | 342/170 |
| 4,537,180 | A | * | 8/1985 | Minor | 126/640 |
| 4,550,533 | A | * | 11/1985 | Fraioli | 52/2.25 |
| 4,704,614 | A | * | 11/1987 | Poirier et al. | 343/703 |
| 4,761,055 | A | * | 8/1988 | Hatje | 359/530 |
| 4,901,481 | A | * | 2/1990 | Seeley, Jr. | 52/2.15 |
| 4,928,012 | A | * | 5/1990 | Lorenz | 250/338.1 |
| 4,931,798 | A | * | 6/1990 | Kogo | 342/4 |
| 4,942,402 | A | * | 7/1990 | Prewer et al. | 342/1 |
| 5,030,390 | A | * | 7/1991 | Nicholls et al. | 261/100 |
| 5,117,229 | A | * | 5/1992 | Niioka | 342/1 |
| 5,260,513 | A | * | 11/1993 | Giles et al. | 174/390 |
| 5,274,356 | A | * | 12/1993 | Taricco | 340/515 |
| 5,331,567 | A | * | 7/1994 | Gibbons et al. | 703/1 |
| 5,453,745 | A | * | 9/1995 | Kudo et al. | 342/1 |
| 5,670,774 | A | * | 9/1997 | Hill | 250/203.4 |
| 5,685,122 | A | * | 11/1997 | Brisbane et al. | 52/745.07 |
| 5,688,348 | A | * | 11/1997 | Diaz et al. | 156/197 |
| 5,970,661 | A | * | 10/1999 | Bishop et al. | 52/2.11 |
| 6,032,080 | A | * | 2/2000 | Brisbane et al. | 700/71 |
| 6,378,387 | B1 | * | 4/2002 | Froom | 73/865.8 |
| 6,598,613 | B2 | | 7/2003 | Fritzsche et al. | |
| 6,637,266 | B1 | * | 10/2003 | Froom | 73/583 |
| 7,420,500 | B2 | * | 9/2008 | Treen et al. | 342/4 |
| 2006/0132355 | A1 | * | 6/2006 | Krenz et al. | 342/165 |
| 2006/0255998 | A1 | * | 11/2006 | Hirata et al. | 342/1 |

FOREIGN PATENT DOCUMENTS

| | | | |
|---|---|---|---|
| EP | 1 273 743 A1 | | 1/2003 |
| GB | 2008646 A | * | 6/1979 |
| JP | 60-174959 A | | 9/1985 |
| JP | 60174959 A | | 9/1985 |

OTHER PUBLICATIONS

Form PCT/ISA/237 w/English translation of pertinent portion (eight (8) pages).

German Office Action, Dated Feb. 17, 2010 with partial translation of portions thereof (6 pages).

Perrin, Jean-Claude, "Les mesures en champ libre", RGE Revue Generale de l'Electricite (1991) December, No. 11, Paris, France, pp. 36-40, XP 000273407.

* cited by examiner

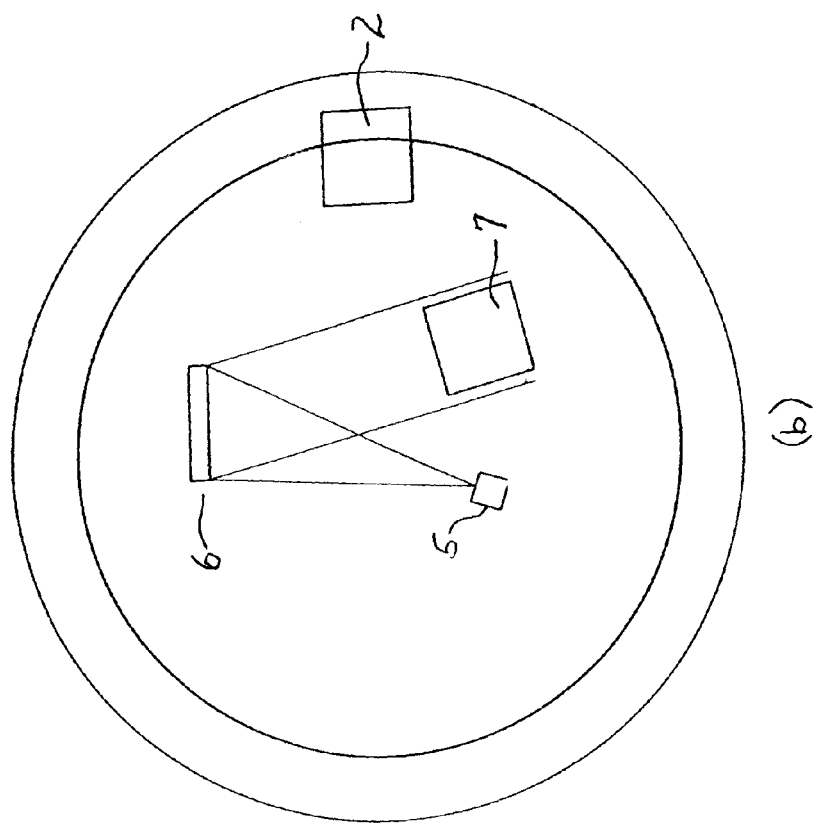
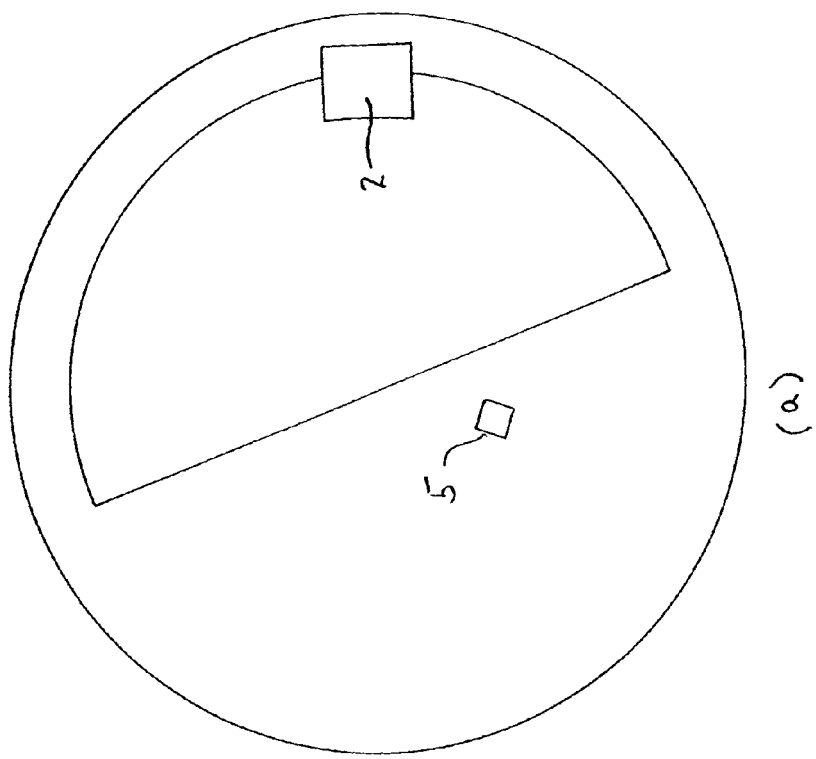
FIG.5

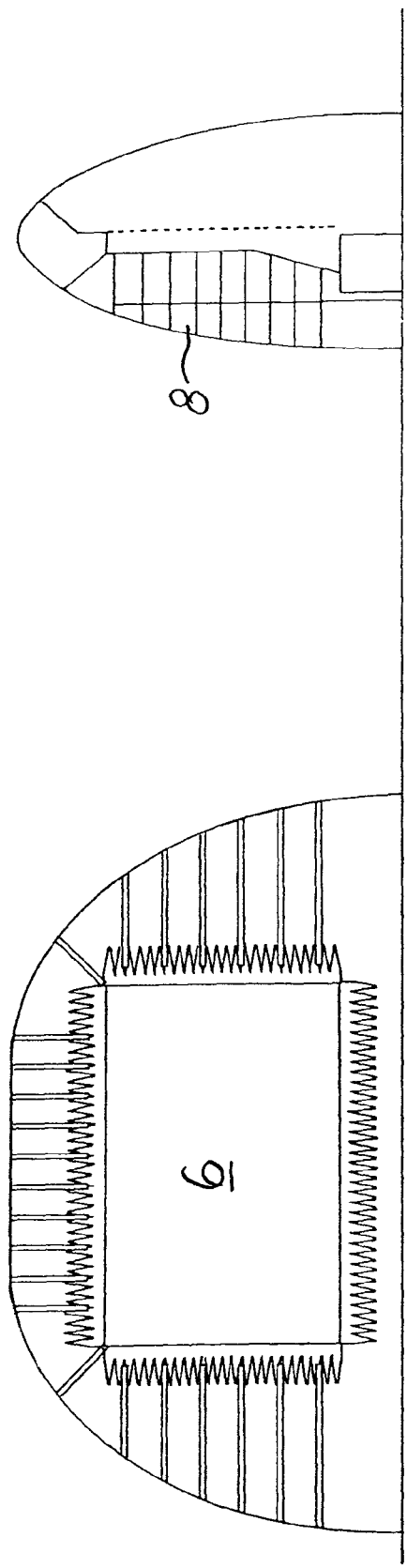
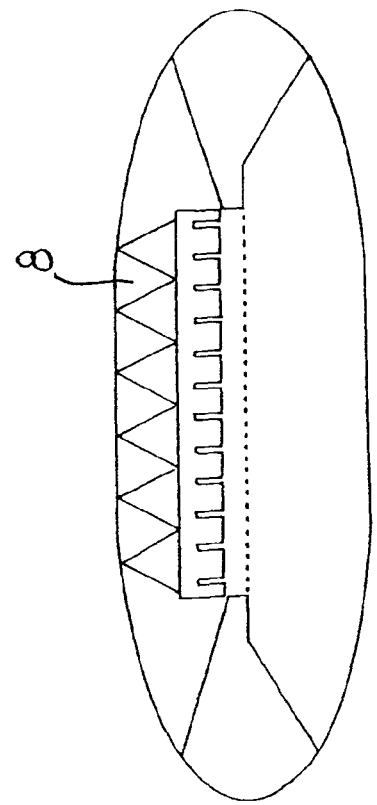
FIG.9

HIGH-FREQUENCY MEASURING ENCLOSURE FOR MEASURING LARGE TEST OBJECTS

This application is a national stage of International Application No. PCT/EP2006/011493, filed Nov. 30, 2006, which claims priority under 35 U.S.C. §119 to German Patent Application No. 10 2005 057 403.3, filed Nov. 30, 2005, and German Patent Application No. 10 2006 056 998.9, filed Nov. 30, 2006, the entire disclosures of which are herein expressly incorporated by reference.

BACKGROUND AND SUMMARY OF THE INVENTION

The present invention relates to a high-frequency measuring enclosure or dome for measuring large test objects.

High-frequency measuring chambers or domes are required for measuring particularly large test objects, such as operational aircraft, mobile radar systems and other large objects which have a changing influence on an electromagnetic field as a result of the reflection of high-frequency radiation. Specifically, it is necessary to measure inside domes instead of in the open air to increase the measuring precision because it ensures protection against climatic influences.

Heretofore, such measurement has been performed in large self-supporting buildings housing large measuring systems which, because of ambient reflections, have to be completely lined with absorber materials. Occasionally, there are solutions consisting of a cupola-like self-supporting lightweight construction whose size, however, is limited for static reasons and which require a sufficient absorber lining particularly for higher measuring frequencies.

One object of the invention is to provide a high-frequency measuring enclosure or dome that is suitable for accommodating particularly large objects, such as measuring systems or parts of measuring systems, ensures the required protection against climatic influences and reduces the need for cost-intensive absorber materials.

This and other objects and advantages are achieved by the high-frequency measuring dome according to the invention, which includes an air-supported membrane or textile construction of a spherical or ellipsoidal contour which is largely pervious to electromagnetic radiation.

The invention has the advantage that, as a result of the spherical or elliptical cupola construction, remaining fractions of electromagnetic radiation, which are reflected, are guided primarily toward the ground.

Another advantage of the invention resides in the use of new textiles or membranes in an almost radio-electrically transparent air-supported dome which, for the most part, does not require the use of cost-intensive absorber materials for suppressing ambient reflections on the ceiling and the walls.

According to another embodiment of the invention, the floor of the high-frequency measuring dome is at least partially lined with absorber material to absorb the electromagnetic radiation still reflected by the interior side of the surface.

Another advantage of the invention is that the floor of the high-frequency measuring dome can be covered partially or completely, or lined, with absorber materials to absorb the remaining reflected fractions of the electromagnetic radiation which, as a result of the spherical or elliptical cupola construction, are guided primarily in the direction of the ground.

According to another embodiment, a high-frequency measuring dome is disclosed which, in addition, has at least one lock for moving in large test objects.

According to another embodiment, the high-frequency measuring dome also has at least one lock for the access by persons.

According to another embodiment, the high-frequency measuring dome is set up to accommodate at least parts of at least one high-frequency measuring system including at least one test object. The high-frequency measuring dome according to the invention may comprise an entire high-frequency measuring system or parts of a high-frequency measuring system including at least one test object. In this case, more than one high-frequency measuring system may also be completely or partially accommodated in the high-frequency measuring dome.

According to another embodiment, the high-frequency measuring dome is configured to accommodate at least parts of at least one high-frequency measuring system without a test object.

The invention has the further advantage that the disclosed high-frequency measuring dome permits a cost-effective protection against climatic influences, which is compatible with the high-frequency measuring method and also allows the complete or partial accommodation of a measuring system.

Other objects, advantages and novel features of the present invention will become apparent from the following detailed description of the invention when considered in conjunction with the accompanying drawings.

BRIEF DESCRIPTION OF THE DRAWINGS

FIG. 5 shows top views of a spherical measuring dome;

FIG. 9 is a view of an arrangement of a shape-adapted air-supported construction for a measuring system requiring protection with additional supporting possibilities of the air-supported dome;

DETAILED DESCRIPTION OF THE DRAWINGS

In contrast to conventional building constructions, according to the invention, air-supported textile constructions are used as the measuring chamber in which, in addition to the test object, the entire measured section can also be accommodated. Such air-supported textile constructions or membranes can be used up to a size of 600 m×200 m floor space, thereby permitting the accommodation of not only the large test objects themselves but also the correspondingly large antenna measuring systems, such as a complete far-field measuring sections or so-called compact ranges and near-field measuring sections.

Among other things, due to the spherical or elliptical contour of the spatial boundary of the dome according to the invention, the electromagnetic energy impinging there is either transmitted by the textile material to the outside or a sufficiently high fraction of it is reflected to the floor of the measuring dome, where it is absorbed by the absorber materials laid out there.

Interference with the measuring field as a result of reflections is thus sufficiently suppressed. The absorber materials which are necessary for lining the ceiling and the wall in a conventional measuring chamber, are therefore not required, and can be eliminated, resulting in savings of at least up to 80% of the relatively expensive absorber material. In large measuring dome of a conventional construction the latter can easily exceed 10 million Euros.

Figure 1:
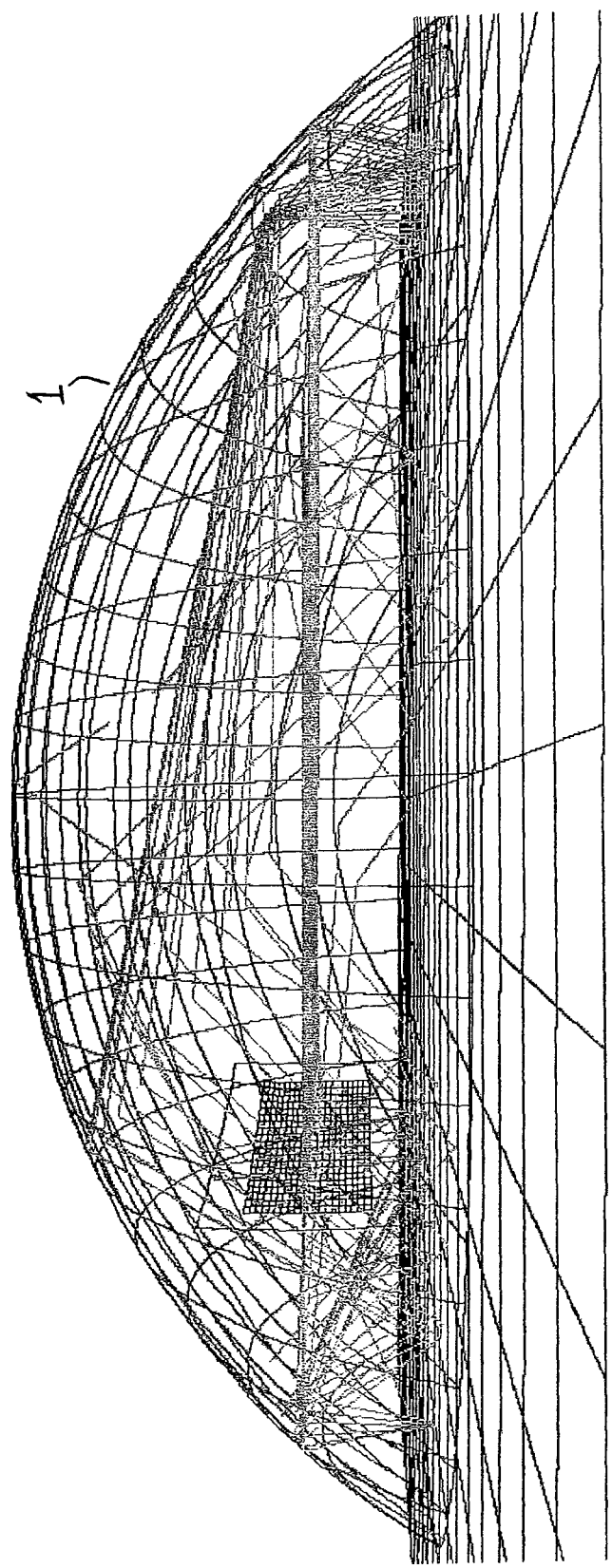
FIG. 1 is a schematic illustration of the reflection behavior of the air-supported dome at higher frequencies.

FIG. 1 shows the reflection behavior of the air-supported dome 1 according to the invention at higher frequencies. The drawing points out the advantageous reflection effects of the spherical or ellipsoidal spatial boundary on the dome floor according to the high-frequency measuring dome of the invention. This reflection behavior was confirmed, for example, by simulation. Also the air supported construction itself results in considerable additional cost savings of up to approximately 70% in the constructional creation, compared to a dome-like building.

Figure 2:
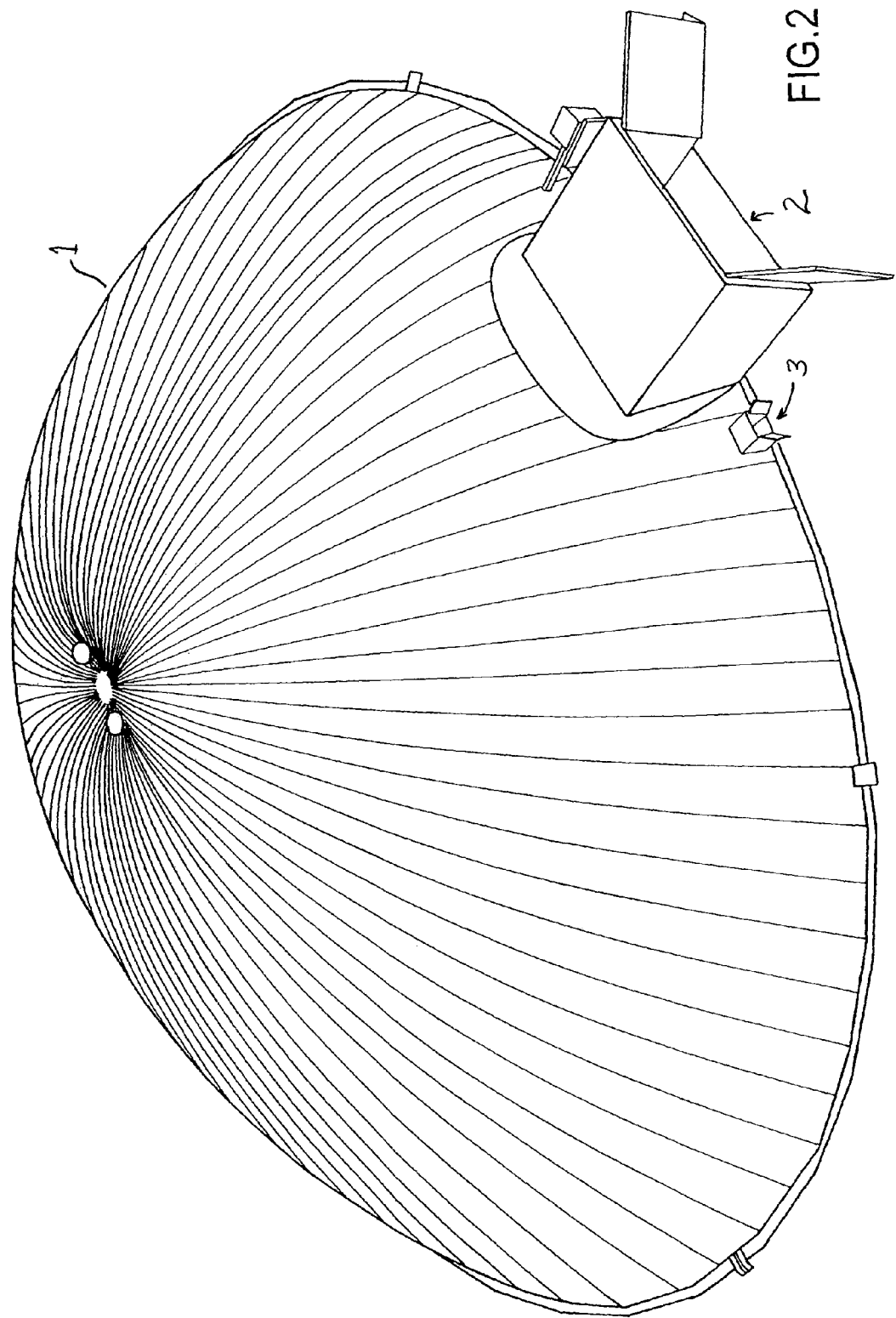
FIG. 2 is a perspective view of an air-supported dome for high-frequency measurements.

FIG. 2 shows a typical air-supported dome 1 having locks 2 for moving in large test objects and locks 3 for an access by persons, designed for use as a high-frequency measuring chamber.

The constructional feasibility per se for such large high-frequency measuring chambers of the above-mentioned size is illustrated in the additional figures. The indicated ratios of sizes and accommodation objects are only indicated as examples in all figures, and do not limit the scope of the invention which can be implemented in various sizes and ratios as well.

Figure 3:
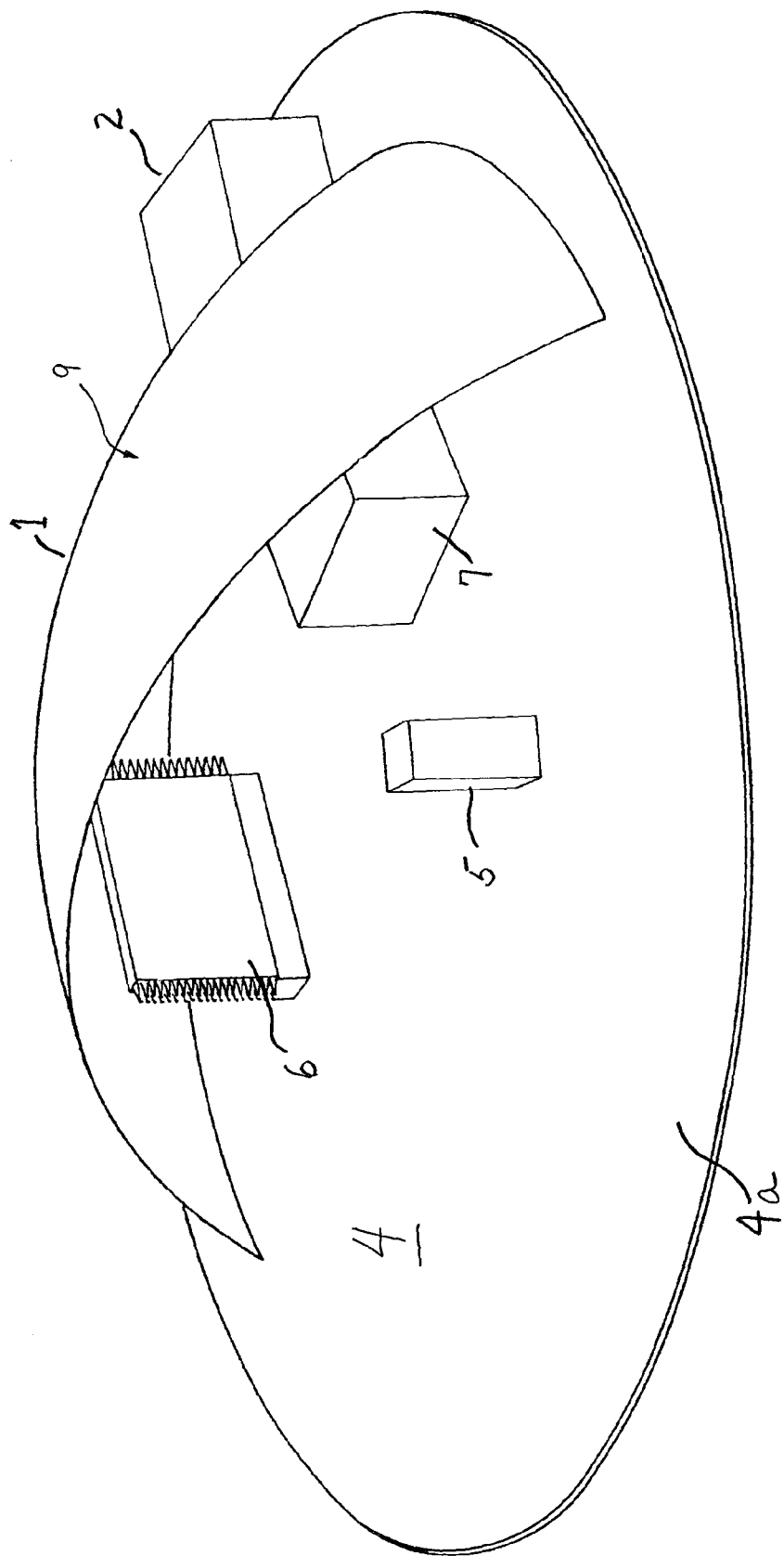
FIG. 3 is a cut away view of an arrangement for accommodating a so-called compact range measuring system in an air-supported dome.

FIG. 3 shows an arrangement for accommodating a so-called compact range measuring system in the air-supported dome or high-frequency measuring dome, including a floor plate 4, which may be covered at least partially with a radiation absorber material 4a. In this case, the air supported dome (air-conditioning shell) 1 is only outlined in order to permit a view into the interior of the high-frequency measuring dome according to the invention. In FIG. 3, a high-frequency supply system 5 for illuminating a reflector 6 are the accommodation objects. A measuring zone 7 and a lock 2 are also illustrated.

Figure 4:
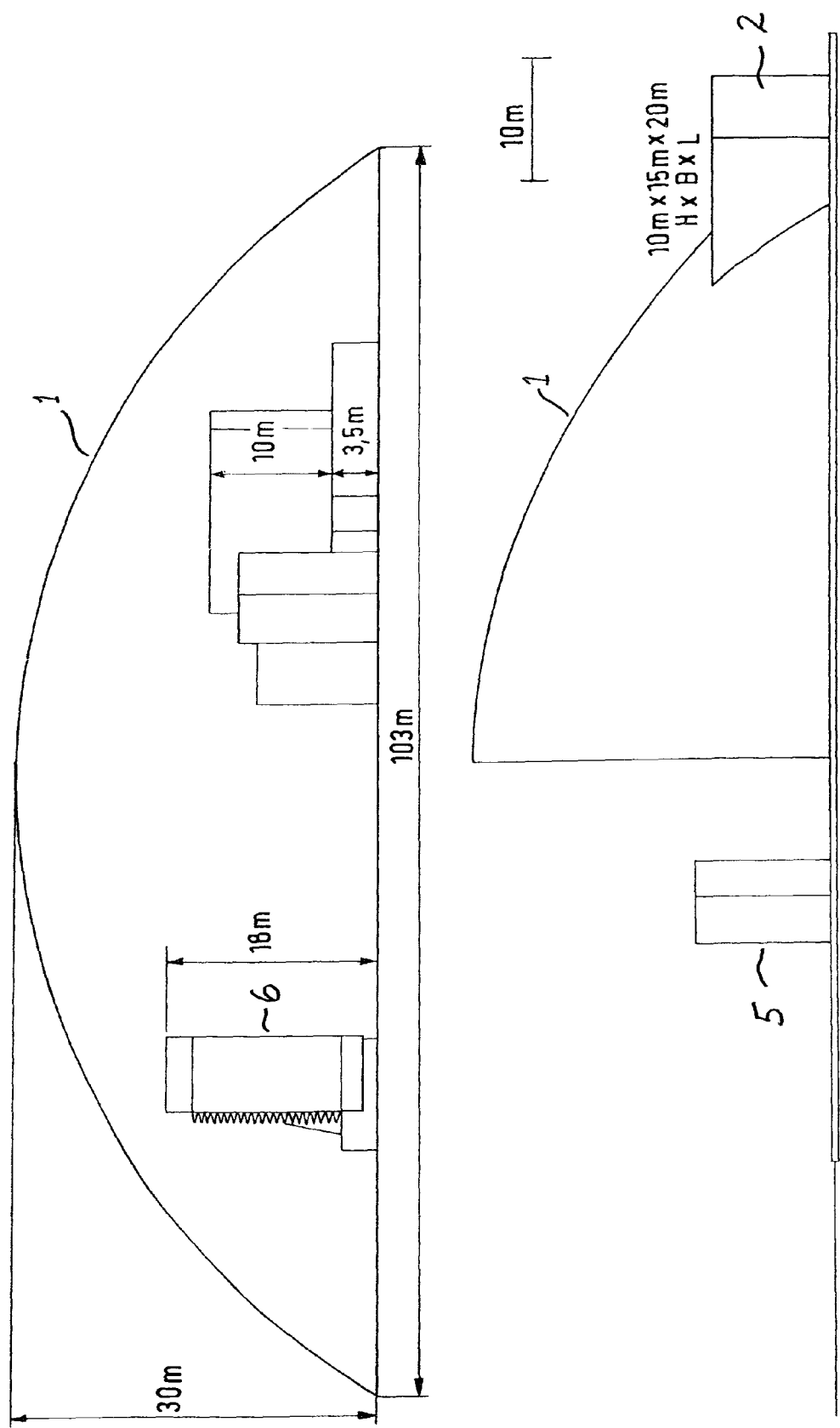
FIG. 4 shows an example of the ratio of sizes of an embodiment of the air-supported high-frequency measuring dome according to the invention.

FIG. 4 shows typical ratios of sizes of an air-supported high-frequency measuring dome. In this case, the dimensional design of the air-conditioning shell is rather conservative. Here, the dimensional design could still be reduced.

FIG. 5 illustrates top views of a spherical measuring dome, with a halved air-conditioning shell (a) and without any air-conditioning shell. In the arrangement without an air-conditioning shell, a high-frequency feeding system 5 for illuminating the reflector 6 are shown as an example. A measuring zone 7 and a lock 2 are also illustrated.

Figure 6:
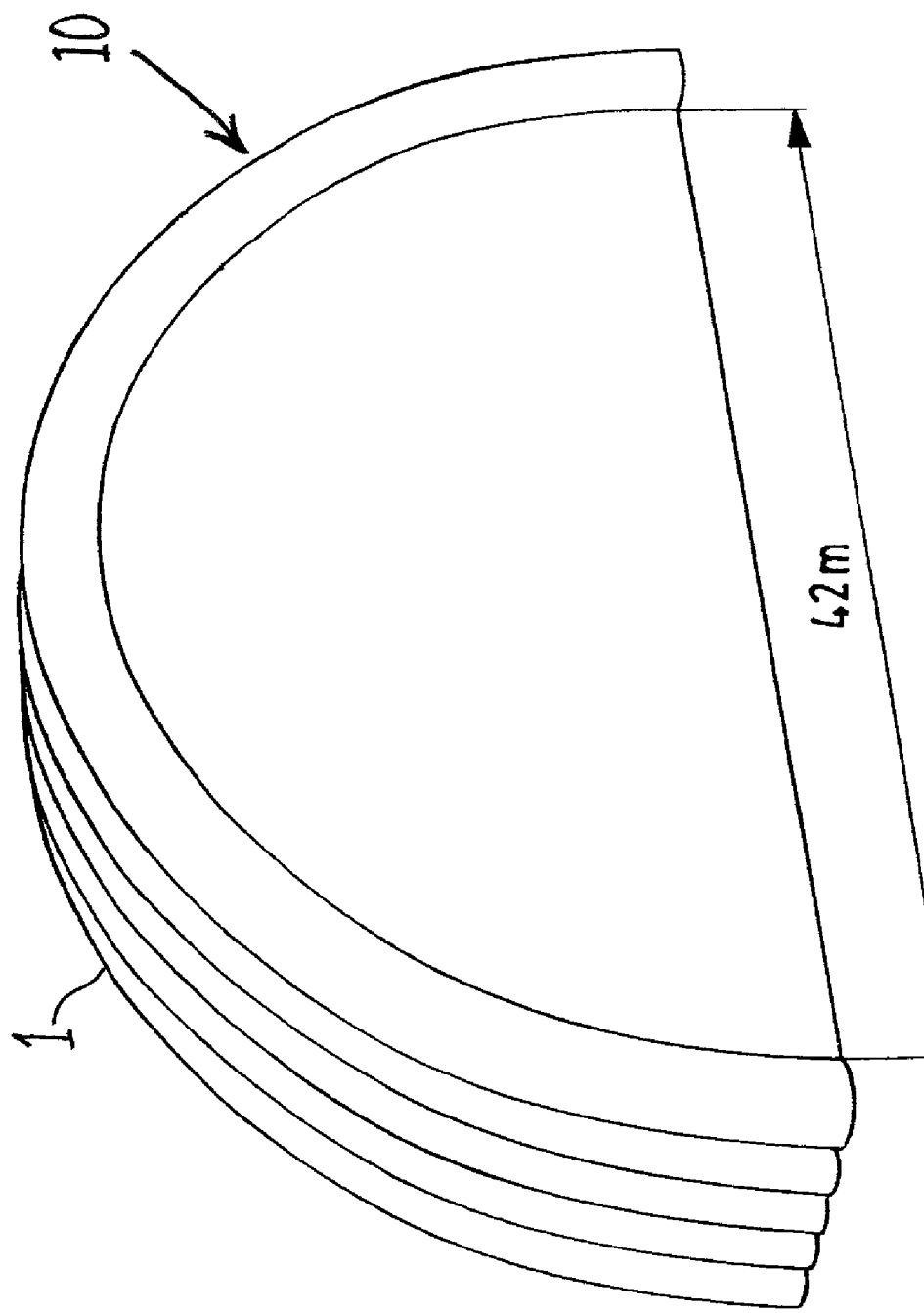
FIG. 6 shows outside views of a semicircular air-supported construction for accommodating a high-frequency measuring system requiring protection.
Figure 7:
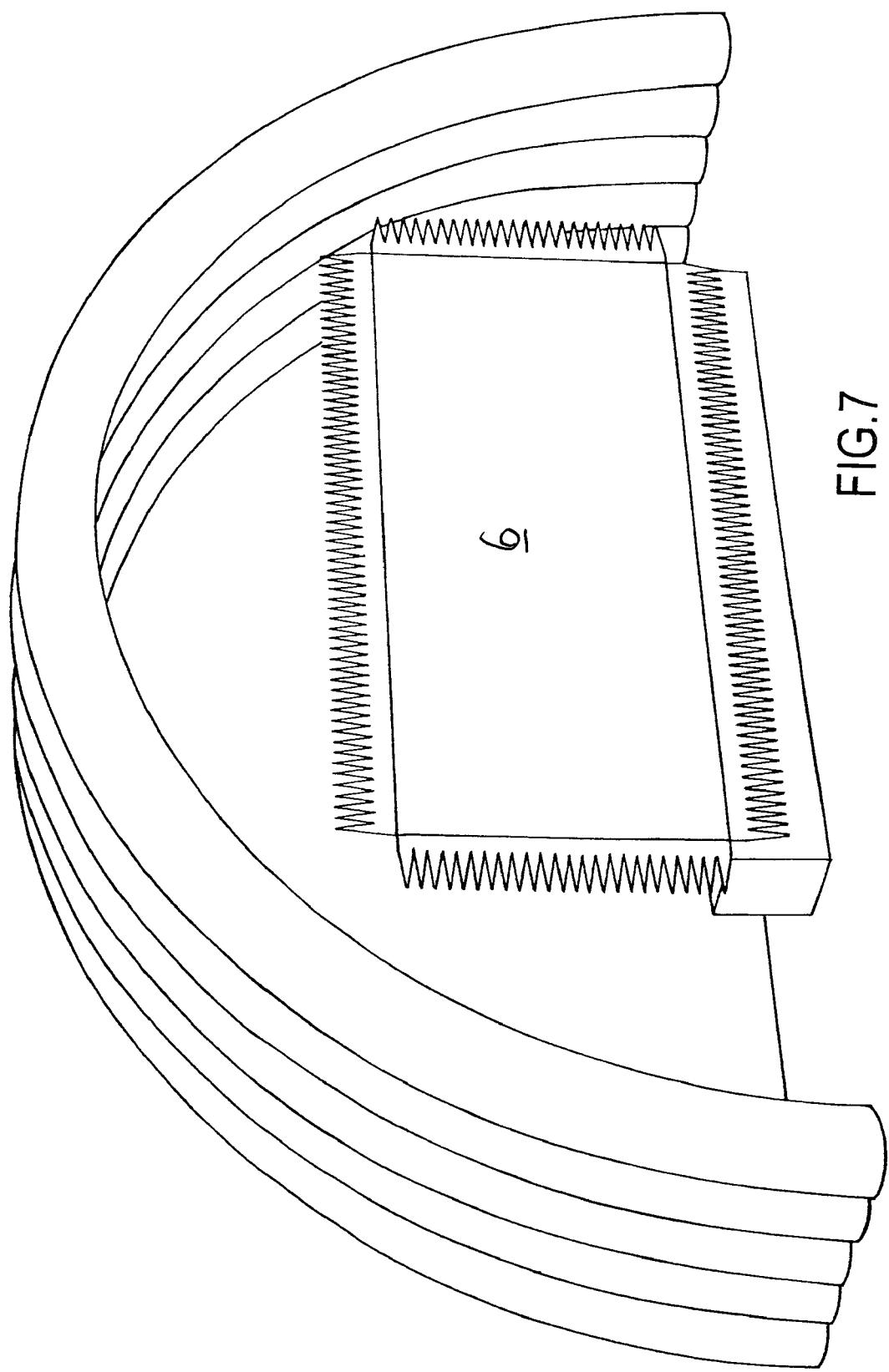
FIG. 7 shows outside views of a semicircular air-supported construction for accommodating a high-frequency measuring system requiring protection and having a high-frequency transparent foil (not shown)

FIG. 6 shows outside views of a semicircular air-supported construction for accommodating a high-frequency measuring system requiring protection. A high-frequency transparent foil or textile material 10 can be used for the air-supported construction. Furthermore, FIG. 7 shows outside views of a semicircular air-supported construction for accommodating a high-frequency measuring system requiring protection and having a high-frequency transparent foil (not shown).

Figure 8:
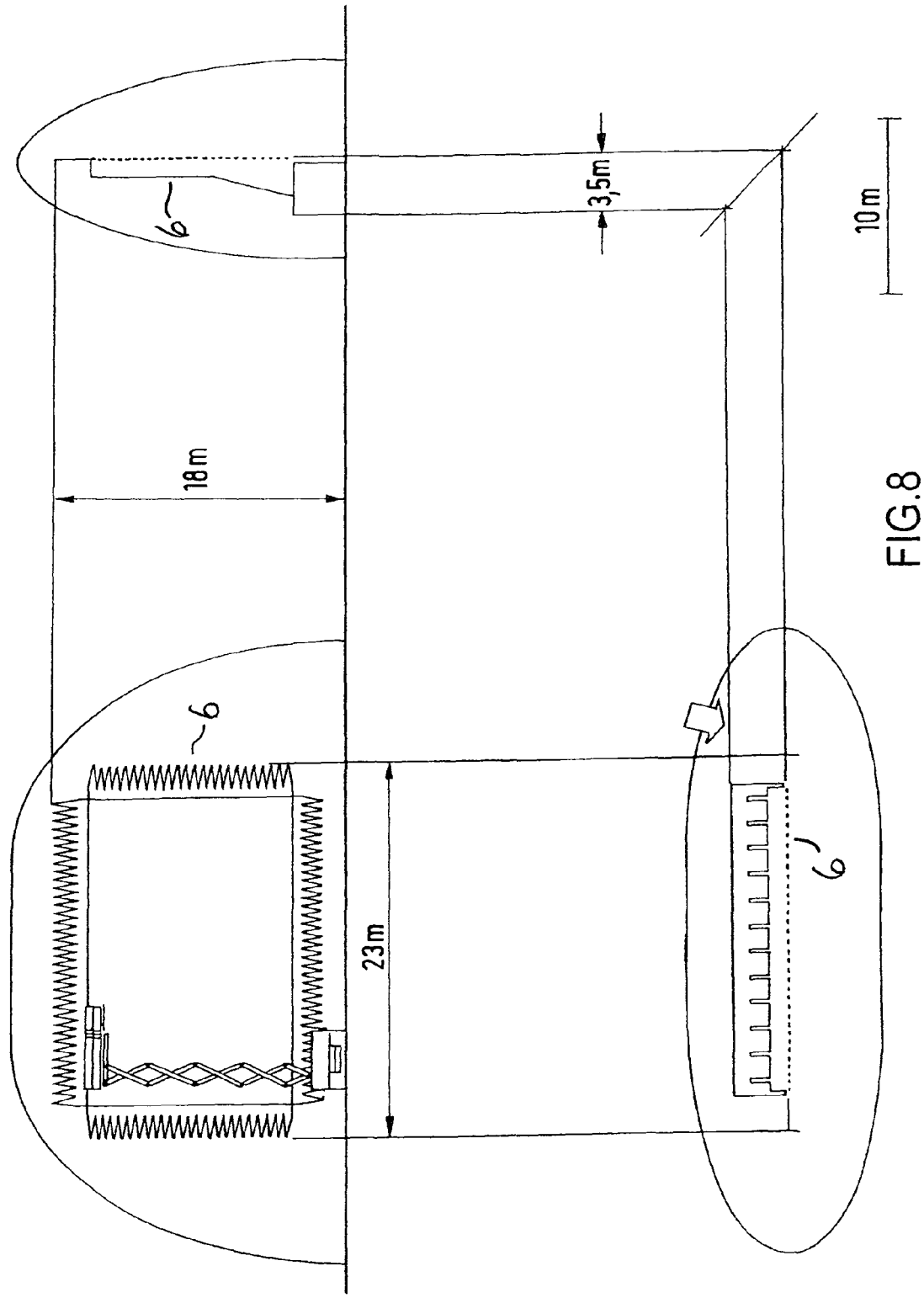
FIG. 8 is a view of an arrangement of a shape-adapted air-supported construction for a measuring system requiring protection.

FIG. 8 shows the arrangement of a shape-adapted air-supported construction for a measuring system requiring protection. In this case, the entrance and the air-conditioning devices may be provided on the back side of the reflector. The entrance opening and the working surface around the reflector 6 may be designed, for example, for the use of a mobile 15 m shear working platform.

FIG. 9 shows an arrangement of a shape-adapted air-supported construction for a measuring system requiring protection and having additional supporting possibilities of the air-supported dome. In this case, metallic struts 8 may be used on the back side of the reflector. Furthermore, reinforcing spar elements made, for example, of Rohacell® HF (a closed-cell rigid foam plastic), may be provided for the air-supported construction. Rohacell® HF is a registered trademark of Evonik Röhm GmbH.

Figure 10:
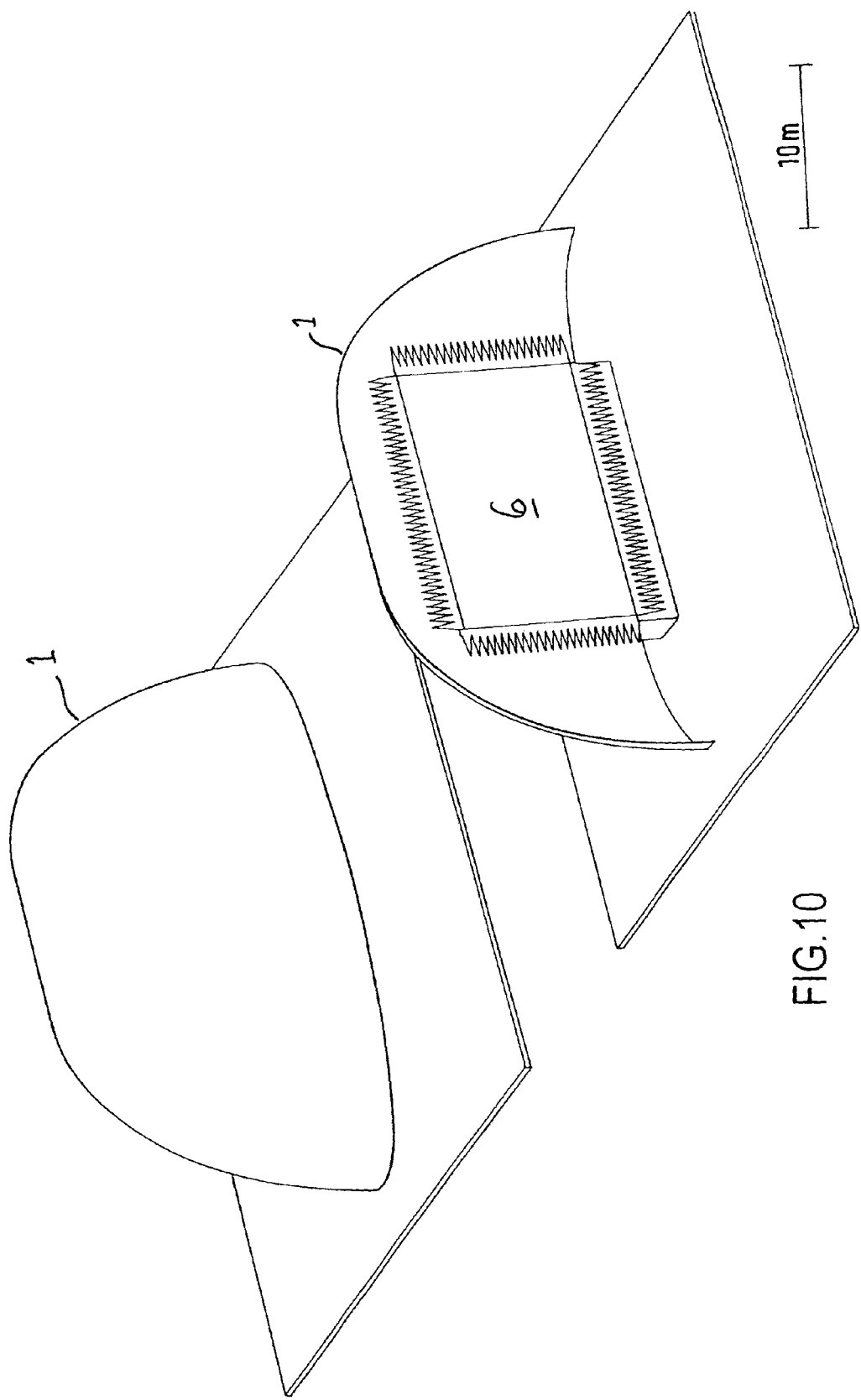
FIG. 10 is a perspective representation of the arrangements of FIGS. 7 to 9.
Figure 11:
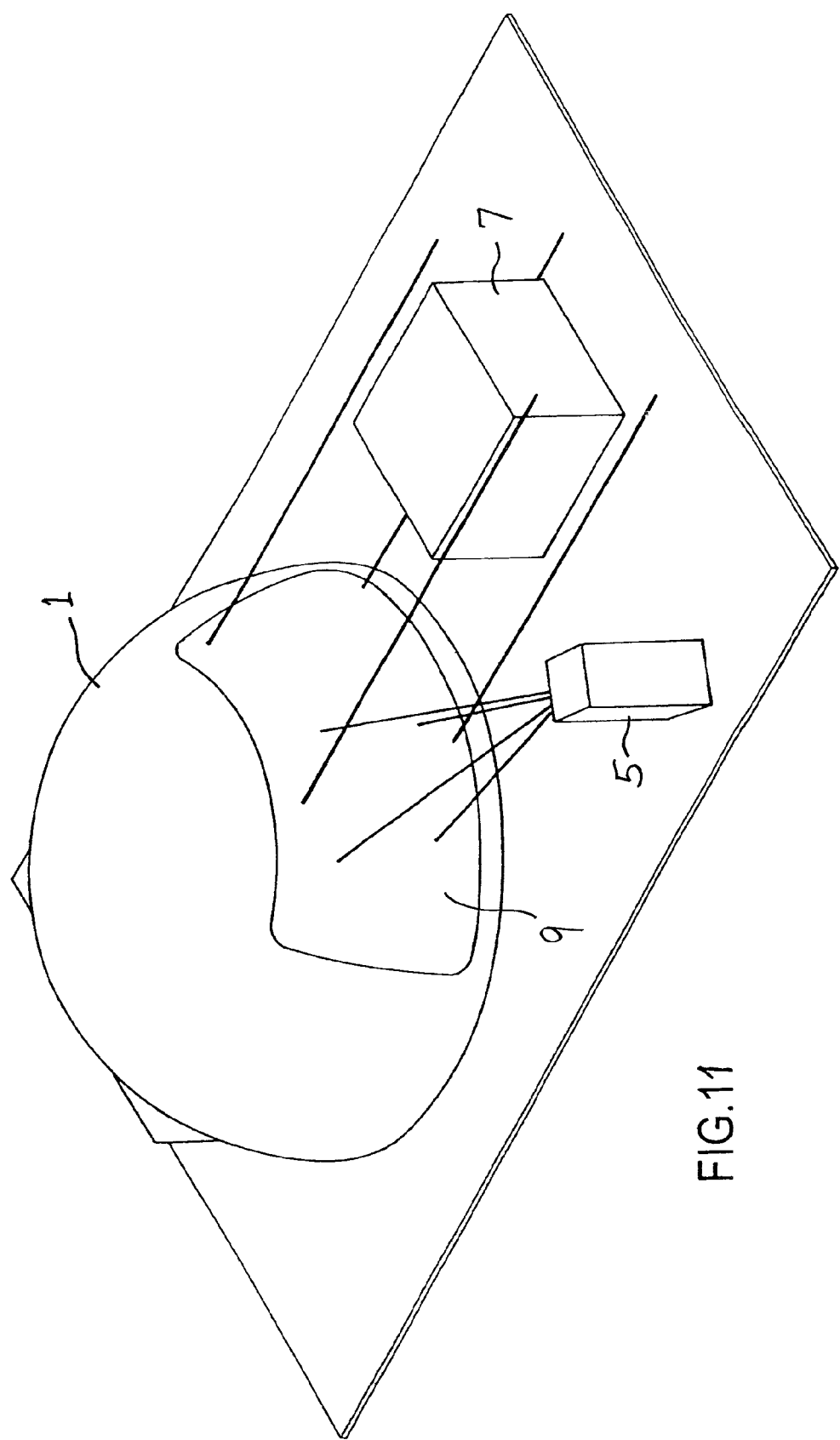
FIG. 11 is a view of an arrangement of measuring systems requiring protection, which is optimized with respect to radiation (hemispherical air-supported construction)
Figure 12:
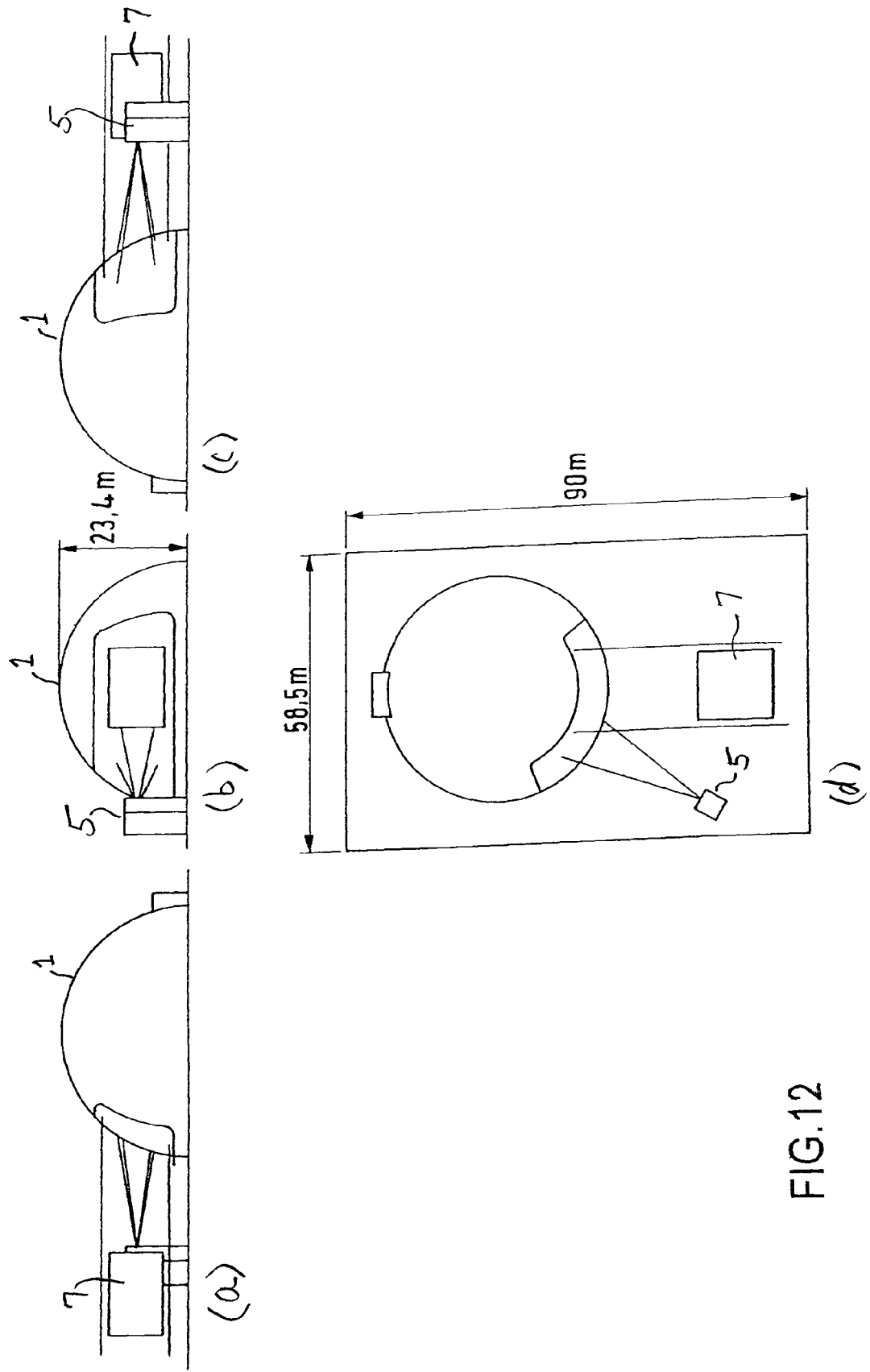
FIG. 12 is a view of an arrangement of measuring systems requiring protection, which is optimized with respect to radiation, with a representative example of ratios of sizes and views.

FIG. 10 is a three-dimensional representation of the arrangements of FIGS. 7 to 9, and FIG. 11 illustrates the arrangement of an accommodation, which is optimized with respect to radiation, of measuring systems requiring protection. In this case, FIG. 11 particularly shows a hemispherical air-supported construction. According to the invention, such a hemispherical air-supported construction may be constructed with a special textile material 9 for implementing the high-frequency beam path of a measuring system. Finally, FIGS. 12(a) through (d) show respective right, front, left and top views of the arrangement of an accommodation of measuring systems requiring protection, which is optimized with respect to radiation, with an example of typical ratios of sizes and views.

Compared to measuring systems in the open air, the high-frequency measuring dome according to the invention has, among others, the advantage of increased measuring precision as a result of i) reduced moisture, wind effects and direct sun radiation, ii) a higher availability of the measuring system because it is independent of weather, and iii) the use of more cost-effective indoor equipment, lower maintenance costs because of less contamination, a longer service life of the measuring equipment and the given camouflage.

Compared to interior measuring systems, the high-frequency measuring dome according to the invention has, among others, the advantage of considerable cost savings for buildings and absorber linings.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A high-frequency measuring system for measuring large test objects, said measuring system comprising:
    an enclosure formed by air-supported dome construction; and
    high frequency measuring apparatus situated at least partially within said enclosure, said measuring apparatus directing high frequency electromagnetic measuring radiation to a measuring zone within said enclosure; wherein,
    the air supported construction is made of one of a membrane and a textile material; and
    said air supported construction is substantially pervious to said electromagnetic measuring radiation;
    said dome construction has a surface contour such that residual measuring radiation that is reflected by an interior of the dome construction is guided primarily to a floor of the enclosure;
    for absorption of said reflected residual measuring radiation, the floor of the high-frequency measuring enclosure is covered at least partially with an absorber material.

2. The high-frequency measuring system according to claim 1, wherein the high-frequency measuring enclosure has a least one lock for bringing in large test objects.

3. The high-frequency measuring system according to claim 1, further comprising at least one lock for the access by persons.

* * * * *